June 12, 1962 E. L. RALPH 3,038,952

METHOD OF MAKING A SOLAR CELL PANEL

Filed May 20, 1959

INVENTOR.
EUGENE L. RALPH

BY

ATTORNEY.

3,038,952

METHOD OF MAKING A SOLAR CELL PANEL

Eugene L. Ralph, Skokie, Ill., assignor to Hoffman Electronics Corporation, a corporation of California Filed May 20, 1959, Ser. No. 814,366
7 Claims. (Cl. 136—89)

The present invention relates to methods of making a large area solar cell panel, and more particularly to methods of joining individual semiconductor pieces electrically and mechanically so as to form a large area solar cell panel.

The use of photovoltaic cells, commonly called solar cells, is well known in the art. Solar cells are conventionally obtained as slices cut from specially prepared single crystal semiconductor ingots. The greater the area of the solar cell, the greater is the power obtained from the cell. But, the greater the area, the less is the efficiency of the cell. By connecting many little cells together as a panel, it is possible to increase the power without decreasing the efficiency. Current methods of interconnecting the solar cells are expensive and inconvenient.

It is an object of the present invention, therefore, to provide a novel method of making a large area solar cell panel.

It is another object of the present invention to provide a method of connecting together indivdual solar cells.

According to the present invention, a method is provided for alloying a metal layer to one end of each of a plurality of semiconductor pieces of a first type of conductivity, converting the semiconductor pieces into rectifying devices operable as solar cells, and connecting together the second type conductivity region of each solar cell.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
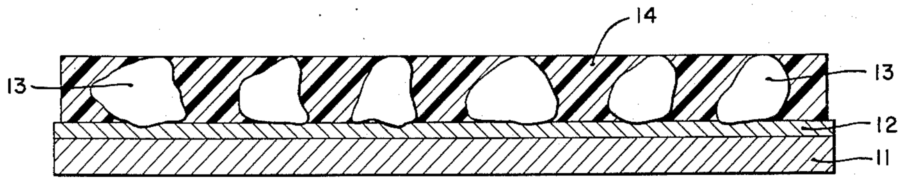
FIGURE 1 is a sectional view of a partially completed solar cell panel.
Figure 2:
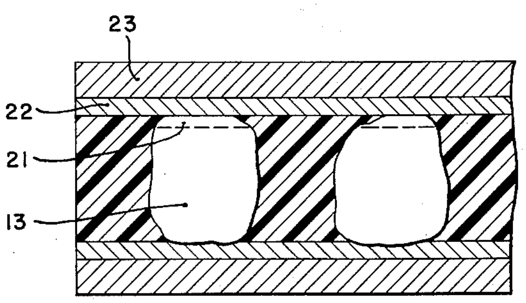
FIGURE 2 shows a portion of FIGURE 1 in detail, according to one embodiment of the present invention.
Figure 3:
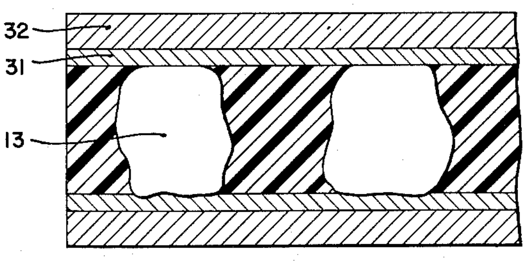
FIGURE 3 shows a portion of FIGURE 1 in detail, according to a different embodiment of the present invention.

Referring now to the drawings, FIGURE 1 shows how a sheet 11 comprising a low resistance metal such as iron or copper is covered with a metal film 12, such as a gold-antimony or an aluminum-antimony compound, by evaporation or plating. Small sphere-like n-type silicon pieces 13 that have been polish-etched in a hydrofluoric-nitric acid mixture are placed on the metal film and heated until alloying occurs and an ohmic contact between the film and each silicon piece is obtained. The silicon pieces and any exposed portions of the metal film are covered with a liquid insulating plastic 14 which is then solidified. The solidified plastic is lapped or ground until the top of each silicon piece is exposed. Either a p-n junction, as shown in FIGURE 2 or a barrier layer, as shown in FIGURE 3, is then produced on the exposed portion of each silicon piece, as follows.

To obtain a p-n junction, aluminum may be evaporated upon the surface of each silicon piece and heated until alloying occurs, to form a region 21 comprising silicon and aluminum, commonly called a beta regrowth region. The unfused alpha aluminum may be removed with hydrochloric acid, and a gold film 22 thin enough to be essentially transparent may be evaporated upon the p-type region of each silicon piece to form an ohmic contact.

A copper grid 23 may then be evaporated or plated upon gold film 22 to obtain a low resistance connection between the p-type region of each silicon piece 13. A positive terminal is connected to one copper sheet or grid and a negative terminal is connected to the other copper sheet or grid.

To obtain a barrier layer, a thin film 31 of gold or platinum about 100 Angstroms thick may be evaporated upon the surface of each silicon piece 13, and a copper grid 32 may be evaporated or plated upon each gold film to obtain a low resistance connection between each silicon piece.

It is essential that there be no direct ohmic connection between the different metallic layers, since such a direct ohmic connection would short circuit the solar cells.

Each solar cell is connected in parallel by reason of two metallic layers, so that the present invention provides a relatively inexpensive method of obtaining a large area solar cell panel without loss of conversion efficiency.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A method of making a large area solar cell panel comprising the steps of: depositing a metal film upon a low resistance metal sheet; placing a plurality of semiconductor pieces of a first conductivity type upon said film; heating said film and pieces until alloying occurs and an ohmic contact is obtained for each piece; covering said film with an insulating material; forming a region of a second conductivity type on the surface of each of said pieces; making an ohmic contact to and electrically connecting together each of said regions of a second conductivity type by depositing a substantially transparent metal film upon said pieces and insulating material; and depositing a low resistance metal grid upon said substantially transparent metal film so as to reduce the resistance thereof.

2. A method as defined in claim 1 in which said metal film comprises gold, said semiconductor pieces comprise silicon, said first conductivity type is n-type, and said second conductivity type is p-type.

3. A method of making a large area solar cell panel comprising the steps of: depositing a first metal film upon a low resistance metal sheet; placing a plurality of semiconductor pieces consisting of only one conductivity type upon said film; heating said film and pieces until alloying occurs and an ohmic contact is obtained for each piece; covering said film with an insulating material; depositing a second metal film upon the surface of each of said pieces to form a barrier layer, said second film being sufficiently thin so as to be substantially transparent; and depositing a low resistance metal grid upon said second film to reduce the resistance thereof.

4. A method of making a large area solar cell panel comprising the steps of: depositing a metal film upon a low resistance metal sheet; placing a plurality of semiconductor pieces consisting of only one conductivity type upon said film; heating said film and pieces until alloying occurs and an ohmic contact is obtained for each piece; covering said film with an insulating material; converting each of said pieces into a rectifying device operable as a solar cell; and depositing a transparent metal film upon each of said pieces to interconnect them.

5. A method of making a large area solar cell panel comprising the steps of: placing a plurality of semiconductor pieces consisting of only one conductivity type upon a first metal layer; heating said layer and pieces until alloying occurs and an ohmic contact between the layer and each piece is obtained, covering said layer with an insulating material; converting each of said pieces into a rectifying device operable as a solar cell; and depositing a transparent metal layer upon each of said pieces to interconnect them.

6. A method of making a large area solar cell panel comprising the steps of: ohmically connecting a first metal layer to each of a plurality of semiconductor pieces consisting of only one conductivity type; covering said first metal layer with an insulating material; converting each of said semiconductor pieces into a rectifying device operable as a solar cell; and ohmically connecting a transparent metal layer to each of said plurality of semiconductor pieces.

7. A method of making a large area solar cell panel comprising the steps of: ohmically connecting a first metal layer to each of a plurality of semiconductor pieces of a first conductivity type; covering said first metal layer with an insulating material; converting each of said semiconductor pieces into a rectifying device operable as a solar cell; and ohmically connecting a transparent metal layer to each of said plurality of semiconductor pieces.

References Cited in the file of this patent

UNITED STATES PATENTS

| | | |
|---|---|---|
| 2,622,117 | Benzer | Dec. 16, 1952 |
| 2,728,809 | Falhenthal | Dec. 27, 1955 |
| 2,786,880 | McKay | Mar. 26, 1957 |
| 2,788,381 | Baldwin | Aug. 9, 1957 |
| 2,820,841 | Carlson et al. | Jan. 21, 1958 |
| 2,823,245 | Solow | Feb. 11, 1958 |
| 2,861,909 | Ellis | Nov. 25, 1958 |
| 2,873,303 | Rittner | Feb. 10, 1959 |
| 2,904,613 | Paradise | Sept. 15, 1959 |